US010249946B2

(12) United States Patent
Meziache et al.

(10) Patent No.: US 10,249,946 B2
(45) Date of Patent: Apr. 2, 2019

(54) ADAPTATION OF AN ANTENNA CIRCUIT FOR A NEAR-FIELD COMMUNICATION TERMINAL

(71) Applicants: STMicroelectronics (Rousset) SAS, Rousset (FR); Melexis Technologies N.V., Tessenderlo (BE)

(72) Inventors: Thierry Meziache, St Maximin la Sainte Baume (FR); Oleksandr Zhuk, Vaumarcus (CH)

(73) Assignees: STMicroelectronics (Rousset) SAS, Rousset (FR); Melexis Technologies SA, Bevaix (CH)

( * ) Notice: Subject to any disclaimer, the term of this patent is extended or adjusted under 35 U.S.C. 154(b) by 342 days.

(21) Appl. No.: 13/914,414

(22) Filed: Jun. 10, 2013

(65) Prior Publication Data

US 2013/0328736 A1 Dec. 12, 2013

(30) Foreign Application Priority Data

Jun. 11, 2012 (FR) ...................................... 12 55447

(51) Int. Cl.
*H01Q 1/50* (2006.01)
*H04B 5/00* (2006.01)
*H03H 7/40* (2006.01)
*H03H 11/48* (2006.01)

(52) U.S. Cl.
CPC ............... *H01Q 1/50* (2013.01); *H03H 7/40* (2013.01); *H03H 11/48* (2013.01); *H03H 11/483* (2013.01); *H04B 5/0031* (2013.01)

(58) Field of Classification Search
CPC .......... H04B 5/02; H04B 5/0012; H04B 5/00; H01Q 1/50; H03H 7/40; H03H 11/483

USPC ........................................ 455/41.1; 343/853
See application file for complete search history.

(56) References Cited

U.S. PATENT DOCUMENTS

| | | | | | |
|---|---|---|---|---|---|
| 3,991,388 | A | * | 11/1976 | Harshbarger | H03K 3/80 331/117 R |
| 4,227,157 | A | * | 10/1980 | Davies | H03F 3/3071 330/265 |
| 4,593,255 | A | * | 6/1986 | Matsuura | H03B 5/1203 331/117 R |
| 5,212,491 | A | * | 5/1993 | Chin et al. | 343/745 |
| 5,625,327 | A | * | 4/1997 | Carroll | H03B 5/1231 331/117 R |
| 5,652,537 | A | | 7/1997 | Fleeman | |
| 6,137,360 | A | * | 10/2000 | Memida | H03F 3/3023 330/253 |

(Continued)

OTHER PUBLICATIONS

Mancini et al. "Op Amps for Everyone, 3rd Edition 2009, Texas Instrument, p. 62".*

(Continued)

*Primary Examiner* — Dieu Hien T Duong
*Assistant Examiner* — Bamidele A Jegede
(74) *Attorney, Agent, or Firm* — Seed Intellectual Property Law Group LLP

(57) ABSTRACT

A method for adapting an antenna circuit including at least one first capacitive element and an inductive element in series, and at least one second capacitive element having a first electrode connected between the first capacitive element and the inductive element, wherein data representative of the voltage of said first electrode are applied to the second electrode of the second capacitive element.

20 Claims, 3 Drawing Sheets

(56) References Cited

U.S. PATENT DOCUMENTS

| | | | | |
|---|---|---|---|---|
| 6,161,165 A * | 12/2000 | Solomon et al. | | 711/114 |
| 6,285,256 B1 * | 9/2001 | Wong | | H03F 3/3028 330/255 |
| 7,269,391 B2 * | 9/2007 | Chiu et al. | | 455/83 |
| 7,659,793 B2 * | 2/2010 | Fukushima | | 333/17.1 |
| 8,130,159 B2 * | 3/2012 | Wuidart et al. | | 343/749 |
| 2003/0212440 A1 * | 11/2003 | Boveja | | A61N 1/08 607/46 |
| 2005/0111681 A1 * | 5/2005 | Essabar | | H04B 5/0012 381/315 |
| 2006/0097800 A1 * | 5/2006 | Guebels | | H03B 5/36 331/46 |
| 2006/0273860 A1 * | 12/2006 | Kasahara | | H03B 1/04 331/158 |
| 2007/0257742 A1 * | 11/2007 | Cha | | H03B 5/1228 331/167 |
| 2008/0211621 A1 * | 9/2008 | Nowottnick et al. | | 340/5.2 |
| 2008/0258828 A1 * | 10/2008 | Sutardja | | H03B 5/1228 331/117 R |
| 2009/0101716 A1 * | 4/2009 | Mani | | G06K 7/0008 235/441 |
| 2010/0074370 A1 * | 3/2010 | Gerlach | | H04B 1/18 375/316 |
| 2010/0112941 A1 * | 5/2010 | Bangs et al. | | 455/41.1 |
| 2010/0144269 A1 * | 6/2010 | Do | | G06K 7/0008 455/41.1 |
| 2010/0291869 A1 * | 11/2010 | Wilson | | G05F 1/46 455/41.1 |
| 2010/0323629 A1 * | 12/2010 | Wuidart | | G06K 19/0701 455/67.11 |
| 2012/0119822 A1 * | 5/2012 | Bas | | G05F 1/10 327/536 |

OTHER PUBLICATIONS

French Search Report dated Feb. 7, 2013 from corresponding French Patent Application No. 12/55447.

\* cited by examiner

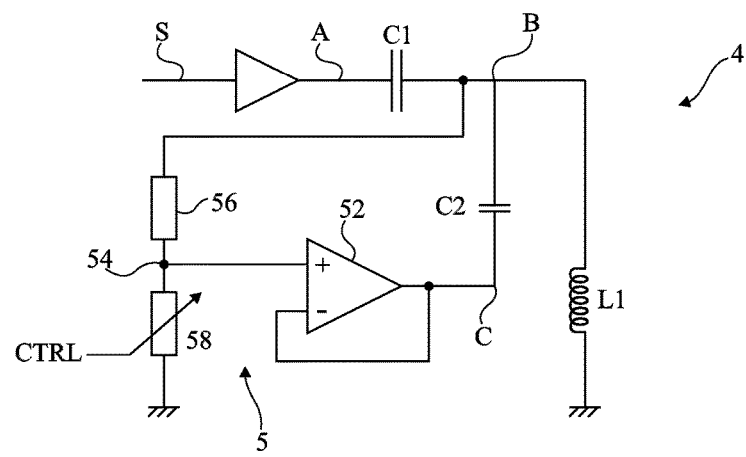
Fig 3
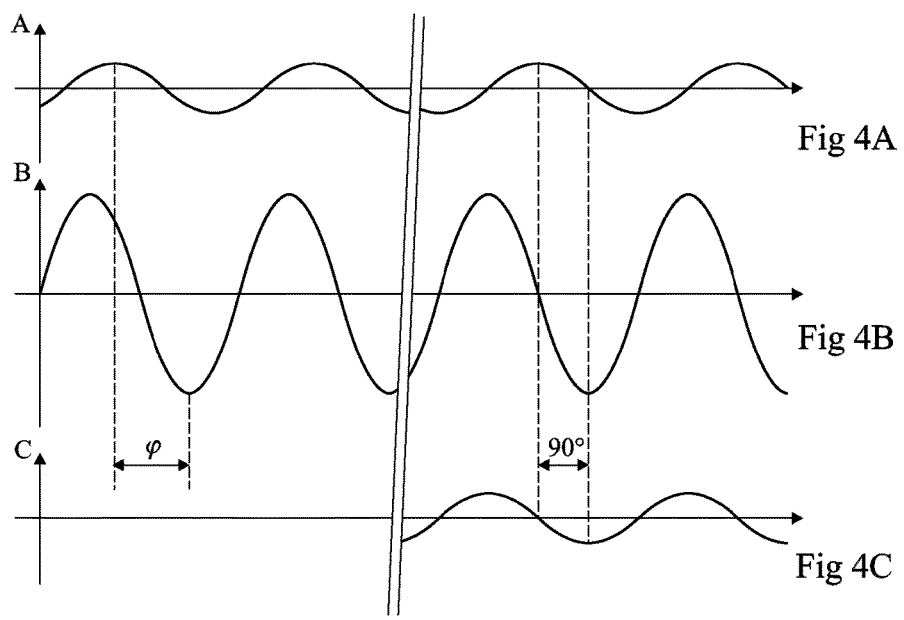
Fig 4A
Fig 4B
Fig 4C

ADAPTATION OF AN ANTENNA CIRCUIT FOR A NEAR-FIELD COMMUNICATION TERMINAL

CROSS REFERENCE TO RELATED APPLICATIONS

This application claims the priority benefit of France patent application number 12/55447, filed on Jun. 11, 2012, which is hereby incorporated by reference to the maximum extent allowable by law.

BACKGROUND

Technical Field

The present disclosure generally relates to radio frequency communications and, more specifically, to near-field communications based on a short-distance electromagnetic coupling between a terminal and a transponder. The present disclosure more specifically relates to the frequency adaptation of an oscillating circuit of a terminal.

Discussion of the Related Art

Electromagnetic transponder systems used in near field communications are now well known. They can, for example, be found in portable devices (Smartphones, touch pads, etc.), which are equipped with near field communication (NFC) devices. The operation of such systems is based on the transmission of a radio frequency radiation by a terminal or reader in order to communicate with, and possibly to remotely supply, a transponder present in the field of the terminal. The terminal and the transponder are each equipped with an oscillating circuit (antenna plus capacitive element) and are generally tuned to the same frequency (typically 13.56 MHz for the NFC standard).

An issue lies in the fact that the components used to form the oscillating circuits undergo drifts due not only to manufacturing tolerances, but also to temperature variations.

This problem is particularly critical for terminals which have to generate the electromagnetic field. Indeed, integrated circuit technology limits to a few volts the excursion of the voltage that can be provided. To generate a higher voltage, monolithic power components would have to be used, which is not desirable. As a consequence, the resonance should be generated outside of the integrated circuit to be able to reach an excursion of some ten volts (typically on the order of 30 volts). As a result, capacitive elements cannot be integrated. Now, with discrete component, dispersions generally reach approximately 10% and at best approximately 5%. Such tolerances are reflected on the resonance frequency.

Currently, terminals are most often formed with adjustable capacitive elements. The capacitive element setting is performed in a test or maintenance operation. This, however, does not enable to compensate for possible operating drifts linked, for example, to temperature variations.

A detuning between the oscillating circuits of the transponder and of the terminal is particularly important since the tuning conditions the quality of the transmission, and especially of the distance at which a transponder must be from a terminal for a communication to be able to occur.

SUMMARY

An embodiment provides an antenna adaptation circuit for an electromagnetic field generation terminal.

Another embodiment provides an adaptation which does not modify the inductive element of the antenna.

Another embodiment provides a solution automatically adapting to operating drifts.

Thus, an embodiment provides a method for adapting an antenna circuit comprising at least one first capacitive element and an inductive element in series, and at least one second capacitive element having a first electrode connected between the first capacitive element and the inductive element, wherein data representative of the voltage of said first electrode are applied to the second electrode of this second capacitive element.

According to an embodiment, an image of the signal present on said first electrode is applied to said second electrode.

According to an embodiment, said data are in phase with the signal present on the first electrode.

According to an embodiment, said data are a voltage proportional to the voltage present on the first electrode.

According to an embodiment, the method is adapted to an antenna circuit comprising two first capacitive elements and two second capacitive elements, the first two capacitive elements being in series with the inductive element and each second capacitive element having a first electrode connected between the inductive element and one of the first capacitive elements, and data representative of the voltage of each first electrode being applied to second respective electrodes of the second capacitive elements.

Another embodiment provides an antenna circuit for an electromagnetic field generation terminal capable of implementing the above method.

According to an embodiment, the circuit comprises a resistive dividing bridge between said or each first electrode and the ground.

According to an embodiment, the midpoint of said resistive dividing bridge is connected, via an amplifier, to said or each second electrode.

According to an embodiment, the midpoint of the resistive dividing bridge is applied to a first terminal of an XOR-type logic gate having a second terminal receiving data representative of the signal applied to the antenna circuit and having its output providing data relative to the phase shift between the two electrodes of the first capacitive element.

According to an embodiment, said data relative to the phase shift are converted into a voltage applied to said or each second electrode.

Another embodiment provides a terminal for generating an electromagnetic field comprising an antenna circuit such as hereabove.

The foregoing and other features and advantages will be discussed in detail in the following non-limiting description of specific embodiments in connection with the accompanying drawings.

BRIEF DESCRIPTION OF THE DRAWINGS

FIG. 3 is an electric diagram of an embodiment of the antenna circuit;

FIGS. 4A, 4B, and 4C illustrate, in the form of timing diagrams, the operation of the circuit of FIG. 3;

DETAILED DESCRIPTION

Figure 1:
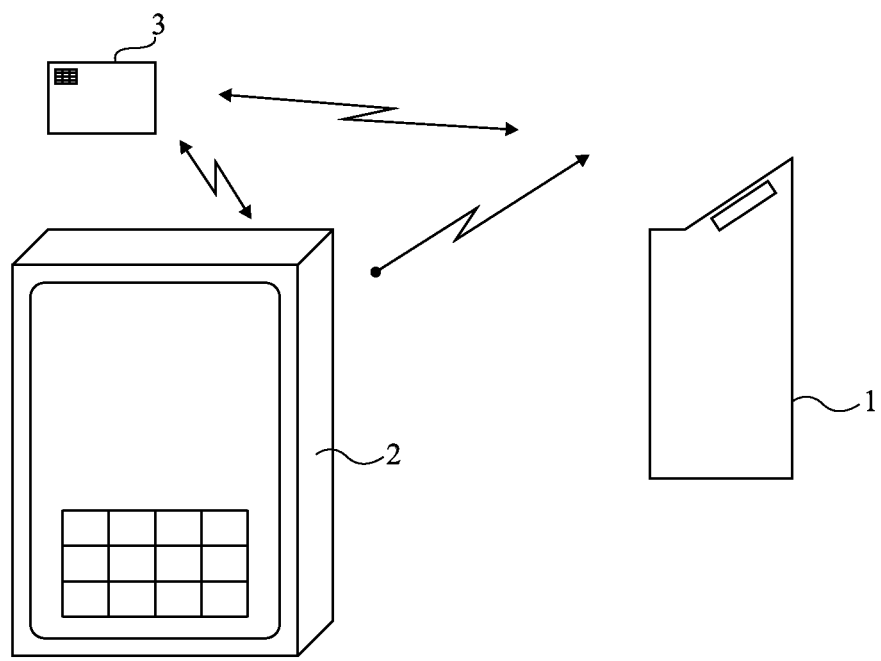
FIG. 1 very schematically shows an example of an electromagnetic transponder communication system.

The same elements have been designated with the same reference numerals in the different drawings, where the timing diagrams have been drawn out of scale. For clarity, only those steps and elements which are useful to the understanding of the described embodiments have been shown and will be detailed. In particular, the communications between a terminal and an electromagnetic transponder have not been detailed, the described embodiments being compatible with usual transmissions. Further, the practical forming of the inductive elements of the antennas has not been detailed either, the described embodiments being here again compatible with usual terminals.

FIG. 1 very schematically shows an example of a near-field transmission system.

An electromagnetic field generation terminal 1 intended for near-field communications may be formed of a fixed device 1, for example, a transport ticket reader or validator, an access control terminal, etc. It may also be a mobile device equipped with an electromagnetic field generation terminal.

An electromagnetic transponder capable of communicating with terminal 1 is, for example, a device 2 of Smartphone, touch pad, or other type, or a contactless chip card 3.

More and more often, Smartphone-type portable devices 2 are capable of operating as transponders (card mode) and communicate with a terminal, or as terminals (reader mode) and communicate with a contactless card 3 or with another Smartphone.

These are examples only and the embodiments which will be described more generally apply to any type of terminal.

The operation of near-field communication systems is known and will not be detailed any further.

Figure 2:
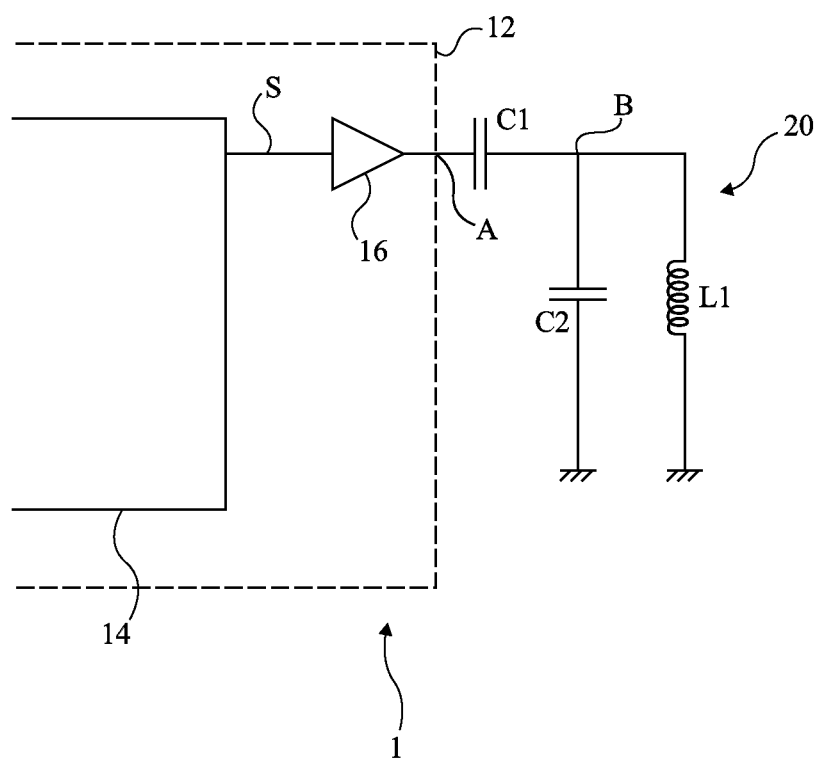
FIG. 2 is a simplified representation of a terminal equipped with a usual antenna circuit.

FIG. 2 is a simplified electric diagram of a usual electromagnetic field generation terminal, for example, of the type of terminal 1 of FIG. 1. One or several integrated circuits 12 integrate electronic circuits (symbolized by a block 14) for generating signals to be transmitted and for processing received signals. For a transmission, a signal S to be transmitted is sent by circuit 14 to an amplifier 16 having an output driving an antenna circuit 20 external to integrated circuit 12. Antenna circuit 20 forms an oscillating circuit formed of a first capacitive element C1 in series with an inductive element L1 between output amplifier 16 and the ground, and of a second capacitive element C2 in parallel with inductive element L1. Inductive element L1 is the device antenna (most often a conductive winding) and its free end is grounded in the example of FIG. 2. In a differential embodiment, antenna L1 (and capacitor C2) connects two capacitive elements C1 respectively assigned to each of the paths.

When the antenna circuit is tuned, the signal in the antenna (node B) has a maximum amplitude. The remote supply intended for the transponders is maximum and the phase difference between nodes A (output of amplifier 16) and B is 90°. This phase shift is introduced by capacitive elements C1 and C2.

Capacitive elements C1 and C2 have values of several tens, or even several hundreds, of picofarads. These values are capable of varying from one terminal to another due to manufacturing dispersions and, for a same terminal, during the operation, for example, under the influence of temperature.

In operation, the value of the inductance may also occur to be modified by environmental factors, which here again causes a detuning of the antenna circuit.

To date, possible adaptations of the capacitive value of the antenna circuit are performed by using a variable capacitance C2. This enables, in end-of-manufacturing tests, to adjust the antenna circuit resonance. However, such a variable capacitance cannot be integrated. Further, an adjustment of the capacitor value at the end of the manufacturing does not solve the problem of drifts in operation.

FIG. 3 is a representation of an embodiment of an antenna circuit 4.

According to this embodiment, instead of being grounded, the electrode of capacitive element C2, opposite to node B is connected to a terminal C having a circuit 5 setting a voltage level. The function of circuit 5 is to vary the voltage of node C according to the voltage variations at node B. In other words, the voltage applied to node C is variable (in practice, at the frequency of the signal in the antenna), as an image of the voltage at node B. Preferably, the signal applied to node C is in phase with the signal at node B.

In the embodiment illustrated in FIG. 3, circuit 5 comprises a follower-assembled differential amplifier 52 having its output terminal connected to node C and having a non-inverting input (+) connected to junction point 54 of a resistive dividing bridge comprising two resistors 56 and 58 in series between node B and the ground. The inverting terminal (−) of amplifier 52 is connected to its output.

The function of resistive bridge 56, 58 is to attenuate the voltage excursion at the level of amplifier 52. Indeed, the potential variation at node B may reach several tens of volts, which is too long for amplifier 52.

Actually, circuit 5 copies at node C, while attenuating it, the signal present at node B. This enables to automatically compensate for a possible mismatch of the antenna circuit, which translates as a phase shift different from 90 degrees between nodes A and B, whether this mismatch originates from inductive element L1 or from capacitive elements C1 and C2.

Resistor 58 preferably is a variable resistor, as will be seen hereinafter.

FIGS. 4A, 4B, and 4C illustrate the operation of the antenna circuit of FIG. 3. These drawings respectively show example of shapes of signals at nodes A, B, and C. The signal at node A (FIG. 4A) for example corresponds to an A.C. signal at the 13.56-MHz frequency generated by the terminal circuits. To simplify the representation, it is assumed that this signal is not amplitude-modulated.

In the absence of any correction (left-hand portion of the drawings), the voltage of node C is grounded (at 0 volt) and a phase shift φ can then be observed between the signals present at nodes A and B (on the antenna). Assuming a detuning, phase shift φ is different from 90 degrees.

In the right-hand portion of FIG. 4C, the signal at node C is a copy of the signal at node B, attenuated by dividing bridge 56 and 58. This results in a compensation of the phase shift. The phase shift between the signals at nodes A and B then becomes 90 degrees.

In a simplified embodiment, the correction performed by the circuit of FIG. 3 is sufficient.

Still in a simplified embodiment, the value of variable resistor 58 is selected to obtain the right phase shift with the signal at the system work frequency (in the example, 13.56 MHz) during tests. This enables, among other things, to compensate for the slight phase shift introduced by the delay introduced by amplifier 52 in the signal propagation.

In a simplified embodiment, this phase-shift is neglected and the use of resistors already is an improvement, since adjustable resistors may be integrated.

In practice, other phase-shift sources are present, for example, due to a drift of the capacitive elements or to an environmental disturbance of the antenna.

Preferably, the value of resistor 58 is then matched during the operation. This adaptation is then preferably regularly performed, in a calibration phase, started automatically (for example, periodically) or by an operator.

The signal for controlling this variable resistor preferentially originates from a measurement of the phase shift between nodes A and B, converted by circuit 14 into a signal CTRL for controlling the value of variable resistor 58 (for example, a voltage level). Various means may be envisaged to form an integrated variable resistor (MOS transistor, for example), as well as to measure the phase shift between nodes A and B.

Figure 5:
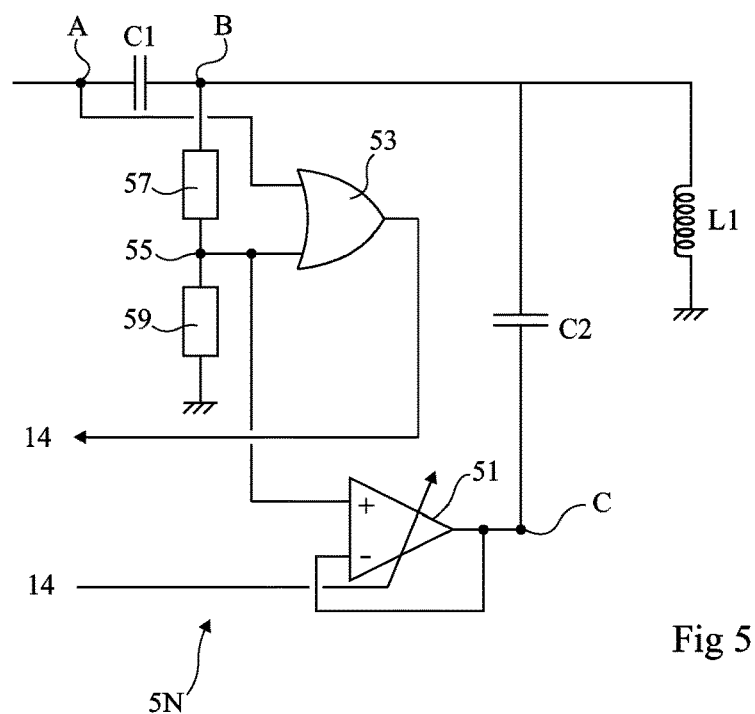
FIG. 5 shows another embodiment of an antenna adaptation circuit.

FIG. 5 partially shows an adaptation circuit 5N according to another embodiment.

It is provided to generate the voltage to be applied to node C by means of a settable-gain differential amplifier 51, assembled as a follower, having its output connected to node C and which exploits data linked to the phase shift between nodes A and B. For example, a circuit for measuring this phase shift is formed of an XOR-type logic gate 53 having a first input directly connected to node A and having a second input connected to midpoint 55 of a resistive dividing bridge formed of two resistors 57 and 59 of fixed value in series between node B and the ground. The output of gate 53 is sent to circuit 14 and provides data relative to the value of the phase shift. The circuit then delivers a gain reference value to amplifier 51 according to this phase shift. The non-inverting input of amplifier 51 is connected to midpoint 55 and its output is looped back onto its inverting input. The gain reference value may possibly (according to the nature of the amplifier) be a digital reference.

Figure 6:
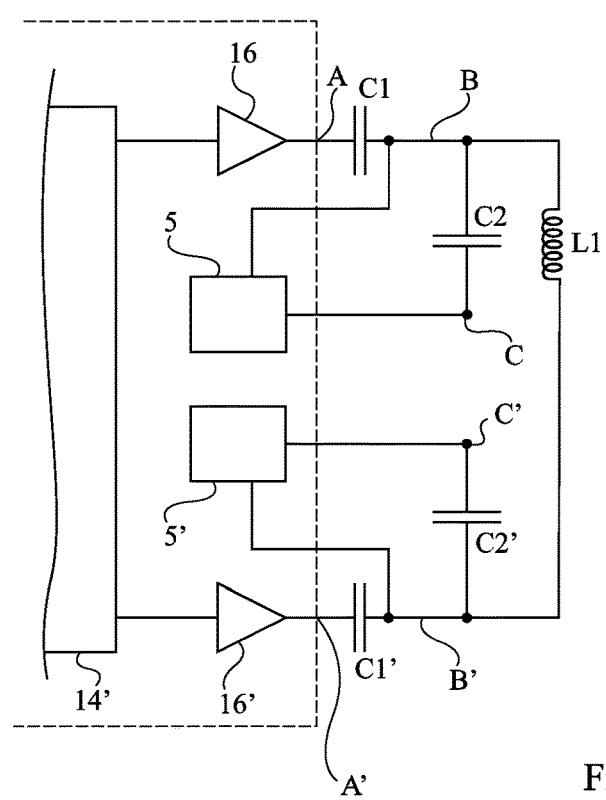
FIG. 6 shows another embodiment adapted to a differential transmission.

FIG. 6 schematically shows another embodiment adapted to a differential transmitter. As compared with the embodiment of FIG. 3, a second path formed of an amplifier 16' and of a capacitive element C1' in series connects circuit 14' to end B' of antenna L1, opposite to its end B. A second capacitive element C2' connects node B' to the output of circuit 5' similar to circuit 5. The operation of the differential embodiment can be deduced from the operation discussed in relation with common-mode embodiments. The digital variation of FIG. 5 may also apply to the differential mode by measuring the phase shift between nodes A' and B'.

An advantage of the described embodiments is that it is now possible to form a self-adaptive antenna circuit in particularly simple fashion. In particular, this circuit can now be integrated and requires no capacitive element of variable value.

Various embodiments have been described. Various alterations, modifications, and improvements will occur to those skilled in the art. Further, the practical implementation of the described embodiments is within the abilities of those skilled in the art based on the functional indications given hereabove and by using tools and components which are also usual. Among the variations that can be envisaged, it may be provided to replace the resistive bridges with capacitive dividing bridges. Further, the correction made at node C may be inverted, that is, it may be negative instead of positive (this amounts to inverting the shape of the right-hand portion of FIG. 4C). Further, the sizing of the components is within the abilities of those skilled in the art according to the application and especially to the operating frequency of the system.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for adapting an antenna circuit that includes a first capacitive element and an inductive element electrically coupled to each other by a first node, and a second capacitive element having a first electrode electrically coupled to the first capacitive element and the inductive element by the first node, the antenna circuit being tuned for near field communications, the method comprising:
   detecting a voltage at the first node by a first input terminal of a follower-assembled differential amplifier, the amplifier having a second input terminal, and an output terminal connected to the second input terminal; and
   applying a first signal, representative of the voltage at the first node directly to a second electrode of said second capacitive element by the output terminal of the amplifier.

2. The method of claim 1, wherein said first signal is in phase with the voltage at the first node.

3. The method of claim 1, wherein said first signal is a voltage proportional to the voltage at the first node.

4. The method of claim 1, wherein the antenna circuit includes a third capacitive element electrically coupled to the inductor by a second node and a fourth capacitive element having a first electrode electrically coupled to the third capacitive element and the inductor by the second node, the method further comprising applying a second signal, representative of a voltage at the second node, to a second electrode of the fourth capacitive element.

5. The method of claim 1, further comprising:
   detecting a phase shift between an input signal to the antenna circuit and the voltage at the first node, wherein the amplifier comprises a settable gain amplifier, and applying the first signal includes using the settable gain amplifier, having a gain reference value that depends on the phase shift, to supply the first signal to the second electrode of the second capacitive element.

6. The method of claim 1, wherein detecting a voltage at the first node includes detecting the voltage at the first node through a resistive dividing bridge coupled to the first input terminal of the amplifier.

7. An antenna circuit, comprising:
   a first capacitive element and an inductive element electrically coupled to each other by a first node;
   a second capacitive element having a first electrode electrically coupled to the first capacitive element and the inductive element by the first node; and
   a controller including a differential amplifier having a first input, a second input, and an output, the output connected to the second input and to a second electrode of said second capacitive element, the controller being configured to detect a voltage at the first node, by the first input of the amplifier, and apply a first signal, representative of the voltage at the first node, to the second electrode of said second capacitive element,
   wherein the antenna circuit is tuned for near field communications.

8. The circuit of claim 7, wherein the controller includes a resistive dividing bridge electrically coupled between said first node and a ground terminal, the resistive dividing bridge being configured to receive the voltage at the first node and output from a midpoint of the resistive dividing bridge an intermediate voltage based on the voltage at the first node.

9. The circuit of claim 8, wherein the amplifier is electrically coupled between the midpoint of said resistive dividing bridge and said second electrode of the second capacitive element.

10. The circuit of claim 9, further comprising:
an input configured to receive an input signal, wherein:
the first capacitive element includes a first electrode electrically coupled to the input and a second electrode electrically coupled to the first node; and
the controller includes an XOR-type logic gate having a first terminal electrically coupled to the midpoint of the resistive dividing bridge, a second terminal electrically coupled to the input, and an output configured to provide data relative to a phase shift between the input signal and the voltage at the first node.

11. The circuit of claim 10, wherein the amplifier is configured to provide the first signal as a voltage based on said data relative to the phase shift.

12. An electromagnetic field generation terminal comprising:
antenna circuit that includes:
a first capacitive element and an inductive element electrically coupled to each other by a first node;
a second capacitive element having a first electrode electrically coupled to the first capacitive element and the inductive element by the first node; and
a controller including a differential amplifier having a first input, a second input, and an output, the output connected to the second input and to a second electrode of said second capacitive element, the controller being configured to detect a voltage at the first node, by the first input of the amplifier, and apply a first signal, representative of the voltage at the first node, to the second electrode of said second capacitive element,
wherein the antenna circuit is tuned for near field communications.

13. The electromagnetic field generation terminal of claim 12, wherein the controller includes a resistive dividing bridge electrically coupled between said first node and a ground terminal, the resistive dividing bridge being configured to receive the voltage at the first node and output from a midpoint of the resistive dividing bridge an intermediate voltage based on the voltage at the first node.

14. The electromagnetic field generation terminal of claim 13, wherein the amplifier is electrically coupled between the midpoint of said resistive dividing bridge and said second electrode of the second capacitive element.

15. The electromagnetic field generation terminal of claim 14, wherein the antenna circuit includes an input configured to receive an input signal, wherein:
the first capacitive element includes a first electrode electrically coupled to the input of the antenna circuit and a second electrode electrically coupled to the first node; and
the controller includes an XOR-type logic gate having a first terminal electrically coupled to the midpoint of the resistive dividing bridge, a second terminal electrically coupled to the input of the antenna circuit, and an output configured to provide data relative to a phase shift between the input signal and the voltage at the first node.

16. The electromagnetic field generation terminal of claim 15, wherein the amplifier is configured to provide the first signal as a voltage based on said data relative to the phase shift.

17. A method for tuning a near field communications antenna circuit, the antenna circuit including a first node coupled to a first electrode of a first capacitive element, a second node coupled to a second electrode of the first capacitive element, the second node further coupled to a first electrode of a second capacitive element and to an inductive element, and a third node coupled to a second electrode of the second capacitive element, the method comprising:
detecting a voltage at the second node by a first input terminal of a follower-assembled differential amplifier, the amplifier having a second input terminal, and an output terminal connected to the second input terminal; and
compensating a phase shift between the first and second nodes by applying a first signal representative of the voltage at the second node directly to the third node, wherein the antenna circuit tuned for near field communications.

18. The method of claim 17, wherein the first signal is in phase with the voltage at the second node.

19. The method of claim 17, wherein the detecting the voltage at the second node includes detecting the voltage at the second node through a resistive dividing bridge coupled to the first input terminal of the amplifier.

20. The method of claim 17, wherein said first signal is a voltage proportional to the voltage at the second node.

* * * * *